US009438047B2

(12) United States Patent
Thoren et al.

(10) Patent No.: US 9,438,047 B2
(45) Date of Patent: Sep. 6, 2016

(54) METHOD FOR MONITORING THE STATE OF CHARGE, OR REMAINING CAPACITY, OF A DISPOSABLE OR RECHARGEABLE BATTERY

(75) Inventors: Werner Thoren, Steinen (DE); Christian Seiler, Auggen (DE); Stefan Probst, Weil am Rhein (DE); Ingo Laible, Arlesheim (CH)

(73) Assignee: ENDRESS + HAUSER PROCESS SOLUTIONS AG, Reinach (SE)

( * ) Notice: Subject to any disclaimer, the term of this patent is extended or adjusted under 35 U.S.C. 154(b) by 357 days.

(21) Appl. No.: 12/452,076

(22) PCT Filed: Aug. 3, 2009

(86) PCT No.: PCT/EP2009/060036
§ 371 (c)(1),
(2), (4) Date: Jun. 15, 2010

(87) PCT Pub. No.: WO2010/020534
PCT Pub. Date: Feb. 25, 2010

(65) Prior Publication Data
US 2010/0261044 A1    Oct. 14, 2010

(30) Foreign Application Priority Data
Aug. 19, 2008   (DE) .................. 10 2008 038 415

(51) Int. Cl.
*H02J 7/00*     (2006.01)
*H01M 10/48*    (2006.01)
*G01R 31/36*    (2006.01)

(52) U.S. Cl.
CPC .......... *H02J 7/0004* (2013.01); *H01M 10/482* (2013.01); *G01R 31/3606* (2013.01)

(58) Field of Classification Search
CPC ................. H01M 10/482; G01R 31/3606
USPC ........................... 429/50, 90, 91, 92
See application file for complete search history.

(56) References Cited

U.S. PATENT DOCUMENTS 6,072,299 A * 6/2000 Kurle et al. ............... 320/112
6,903,659 B2   6/2005 Vanderah
(Continued)

FOREIGN PATENT DOCUMENTS

DE   38 23 038         1/1990
DE   41 31 981         4/1993
DE   19725238 A1       12/1997
(Continued)

*Primary Examiner* — Ula C Ruddock
*Assistant Examiner* — Thomas Parsons
(74) *Attorney, Agent, or Firm* — Bacon & Thomas, PLLC

(57) ABSTRACT

A method for monitoring charge level or remaining capacity of a battery pack, a disposable battery or a rechargeable battery, which is used to supply energy for an automation technology, field device having a data storage unit associated with the battery pack, disposable battery or rechargeable battery. Specific information about the battery pack, disposable battery or rechargeable battery is stored in the data storage unit and process-specific and operation-specific information about energy consumption is written to the data storage unit. In the case of the battery pack, disposable battery or rechargeable battery being used in a second automation technology field device, remaining service life of the battery pack, the disposable battery or the rechargeable battery is calculated and output on the basis of the process- and operation-specific information.

8 Claims, 2 Drawing Sheets

(56) References Cited

U.S. PATENT DOCUMENTS

2008/0211664 A1* 9/2008 Griech et al. ............... 340/539.1
2009/0066529 A1* 3/2009 Fukada .............. G01R 31/3689
                                                           340/657

FOREIGN PATENT DOCUMENTS

| DE | 10 2006 055 125 | 6/2008 |
| GB | 02353151 A1 | 2/2001 |
| WO | WO 2005/103851 | 11/2005 |

* cited by examiner

METHOD FOR MONITORING THE STATE OF CHARGE, OR REMAINING CAPACITY, OF A DISPOSABLE OR RECHARGEABLE BATTERY

TECHNICAL FIELD

The invention relates to a method for monitoring the state of charge, or remaining capacity, of a disposable or rechargeable battery, which is used to supply energy of a field device of automation technology.

BACKGROUND DISCUSSION

In process automation technology, as well as manufacturing automation technology, field devices are often employed, which serve to register and/or influence process variables. For the registering of process variables, measuring devices are used, which, in each case, exhibit at least one sensor and one measurement transmitter. Such measuring devices include, for example, fill-level measuring devices, flow measuring devices, pressure and temperature measuring devices, pH-redox potential measuring devices, electrical conductivity measuring devices, etc., which ascertain the respective process variables, fill-level, flow, pressure, temperature, pH-value and conductivity. For influencing process variables, actuators are used, for example valves or pumps, via which the flow of a fluid in a section of pipeline or the fill-level in a container can be changed.

In principle, all devices, which are employed near to a process and which deliver or work with process-relevant information, are referred to as field devices. In addition to the aforementioned measuring devices/sensors and actuators, units that are directly connected to a fieldbus and which serve to communicate with superordinated units (e.g. remote I/Os, gateways, linking devices and wireless adapters) are also generally referred to as field devices. A large number of these devices are produced and sold by the Endress+Hauser Group.

In modern industrial facilities, field devices are, as a rule, connected with superordinated units via fieldbus systems (e.g. Profibus®, Foundation Fieldbus®, HART®, etc.). Normally, the superordinated units involve control systems or control units, for example a PLC (programmable logic controller). The superordinated units are used, for example, for process control, process visualizing, process monitoring, as well as in the start-up of the field devices. The measurement values registered by the field devices—especially from the sensors—are transmitted via the connected bus system to a superordinated unit, or, as the case may be, to several superordinated units. Additionally, a transfer of data from the superordinated unit to the field devices via the bus system is necessary; this is used especially in the configuring and parametering of field devices or for diagnostic purposes. Generally speaking, the field device is serviced from the superordinated unit via the bus system.

In addition to a hardwired data transmission between the field devices and the superordinated unit, the possibility of a wireless data transmission also exists. In particular, in the case of the bus systems, Profibus®, Foundation Fieldbus® and HART®, a wireless data transmission via radio is specified. Additionally, radio networks for sensors are more precisely specified in the standard IEEE 802.15.4. For the realization of a wireless transmission of data, field devices are designed, for example, as radio-field devices. As a rule, these exhibit a radio unit and an electrical current source as integral components. In such a case, the radio unit and the electrical current source can be provided for in the field device itself, or in a radio module permanently connected to the field device. Through the electrical current source, an autarkic energy supply for the field device is made possible.

Furthermore, there exists the possibility to upgrade field devices without radio units—i.e. the current installed base in the field—to radio-field devices through the attachment of a wireless adapter which features a radio unit. A corresponding wireless adapter is described, for example, in the publication WO 2005/103851 A1. The wireless adapter is, as a rule, connected to a fieldbus communication interface of the field device in a detachable manner. Via the fieldbus communication interface, the field device can transmit data over the bus system to the wireless adapter, which then transmits this via radio to the target location. Conversely, the wireless adapter can receive data via radio and forward it over the fieldbus communication interface to the field device. The supplying of the field device with electrical power then occurs as a rule via an energy supply unit of the wireless adapter.

In the case of autarkic radio field devices and wireless adapters, the communication (for example with a superordinated unit) is, as a rule, conducted via a wireless interface of the radio field device or the wireless adapter. Additionally, such radio field devices or wireless adapters exhibit, as a rule, a hardwired communication interface. The HART standard, for example, provides that the radio field device must, in addition to a wireless interface, also feature a hardwired communication interface. Via such a hardwired communication interface, an on-site configuration of the radio field device or wireless adapter is possible, for example, via a service, or operating, unit (for example a handheld communicator), which is connected to the hardwired communication interface. Furthermore, the hardwired communication interface can be embodied as a fieldbus communication interface, so that the communication is conducted over it according to a bus system, e.g. according to one of the standardized bus systems such as Profibus, Foundation Fieldbus or HART. Through such a fieldbus communication interface, the radio field device or wireless adapter can also be connected to a corresponding hardwired fieldbus.

The energy supply unit or electrical current source of a wireless adapter or a radio field device is normally a disposable battery or a rechargeable battery. It is known to provide the disposable or rechargeable battery with a data storage unit. The static information about the type and characteristics of the disposable or rechargeable battery is stored in the data storage unit. Field devices in stationary or temporary deployment are powered from the disposable or rechargeable battery. The possibility for monitoring the state of the disposable or rechargeable battery is normally provided in the field device.

If the disposable or rechargeable battery is used several times in different field devices, the state of charge, or remaining capacity, of the disposable or rechargeable battery is then unknown. Moreover, the monitoring of the state of the disposable or rechargeable battery is then only possible to a limited degree or not possible at all.

SUMMARY OF THE INVENTION

An object of the invention is to provide a method by which a monitoring of the state of a disposable or rechargeable battery is possible even in the case of changing, temporary uses of the battery, and an apparatus for performing this method.

The object is achieved in that a data storage unit is associated with the disposable or rechargeable battery, wherein the data storage unit stores specific information about the disposable or rechargeable battery; wherein process-specific and operation-specific information concerning the energy consumption is stored in the data storage unit; and wherein, in the case of the use of the disposable or rechargeable battery in a second automation technology, field device, remaining service life of the disposable or rechargeable battery is calculated and output on the basis of the process- and operation-specific information. The output of the information occurs either via a digital communication with a superordinated control room, and/or the information is displayed for the operating personnel on a display unit associated with the second field device.

The data storage unit is, preferably, a flash memory device, especially an EEPROM, which can be operated and read via a serial interface. Specific data, such as the unique identification of the battery and the field device, the device type, are stored once in the data storage unit.

In an advantageous further development of the method of the invention, the storage of the information occurs automatically; alternatively, the storage can also be triggered manually.

A preferred embodiment of the method according to the invention provides that the process-specific and operation-specific information about energy consumption are written to the data storage unit in an event-controlled manner. Such an event involves, for example, a process with high energy consumption. Included among these are, especially, the startup of the field device, the configuration or parametering of the field device or the performance of a diagnostic method for the field device. As an example, in the case of a parametering of the field device—thus in the case of an event with a high energy consumption—the corresponding consumption data are written to the data storage device automatically or though a manually initiated. The same is true in the case of the disposable or rechargeable battery/battery pack being separated from the associated field device. Here, the storage occurs alternately or additionally through an external, preferably manual, triggering.

It is additionally or alternatively provided for that the process-specific and operation-specific information about energy consumption is written to the data storage device as a function of time. In the simplest case, the storage occurs at predetermined time intervals. At regular intervals, consumption data of the disposable or rechargeable battery and data concerning process conditions at the location of use (e.g. temperature) are written to the data storage unit. In the case of the disposable or rechargeable battery being used in another field device, the remaining service life of the disposable or rechargeable battery is newly ascertained on the basis of these process- and operation-specific data.

A preferred embodiment of the method according to the invention provides that the stored information is taken into consideration diagnosis of the disposable or rechargeable battery.

Preferably, an apparatus for performing the method of the inventions provides a disposable or rechargeable battery pack with several disposable or rechargeable batteries, wherein a data storage unit, especially an EEPROM, is associated with the disposable or rechargeable battery pack. In the data storage unit are stored the operation and consumption data and/or the operation- and process-specific information. These are taken into consideration in the monitoring of the disposable or rechargeable battery. Preferably, the registered data concerning the life cycle of the disposable or rechargeable battery are used for diagnostic purposes. It is further provided that the specific information concerning the disposable or rechargeable battery involves information that allows the disposable or rechargeable battery to be uniquely identified.

In the case of the process- and operation-specific information, characteristic process variables at the location of use of the field device come into effect, which influence the remaining service life of the disposable battery or the remaining capacity of the rechargeable battery.

An advantageous embodiment of the apparatus according to the invention provides for that the disposable or rechargeable battery or battery pack is integrated into the field device or into an adaptable radio-adapter on the field device for the radio transmission of data between the field device and a superordinated control unit.

BRIEF DESCRIPTION OF THE DRAWINGS

The invention will now be explained in greater detail on the basis of the appended drawing, the figures of which show as follows.

DETAILED DISCUSSION IN CONJUNCTION WITH THE DRAWINGS

Figure 1:
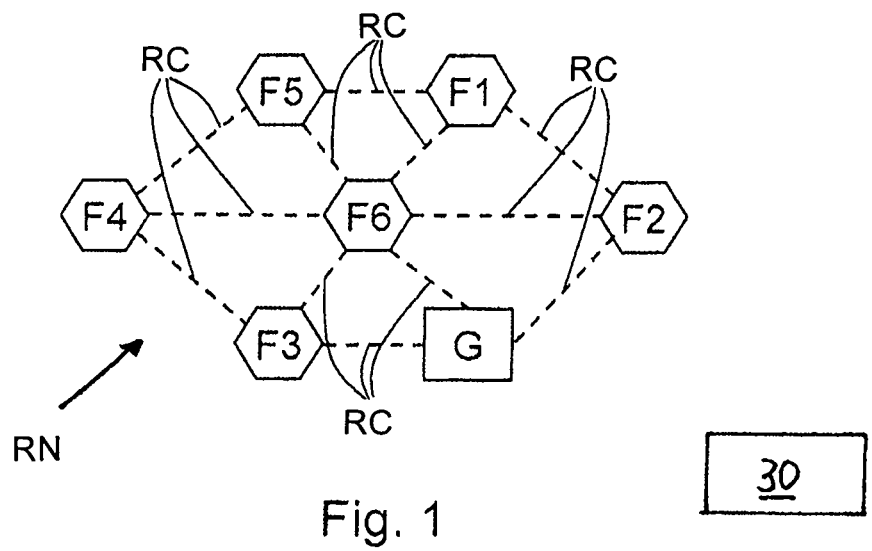
FIG. 1 is a schematic representation of a radio network, into which a number of field devices are integrated.

In FIG. 1, a radio network is shown with several field devices F1, F2, . . . , F6 (each of which is embodied as a radio field device) and a gateway G. The field devices F1, F2, . . . , F6 are connected with each other and the gateway G in the radio circuit RC, which is represented in FIG. 1 through the dashed lines. As the field devices F1, F2, . . . , F6 and the gateway G can in each case communicate with each other over several radio circuits RC, even in the case of the failure of one radio circuit RC, communication remains maintained through one of the other radio circuits RC. The frequency hopping spread spectrum (FHSS) or direct sequence spread spectrum (DSSS) methods, for example, are suitable as radio transmission technologies for the radio circuits RC. Due to the required low transmission powers, Ultrawideband Technology (UWB) is also quite well-suited. The gateway G can involve a long distance transmission unit, e.g. the product "Fieldgate" from the company Endress+Hauser. In this case, the Gateway G can communicate with a superordinated unit either worldwide (for example via the internet), GSM or through a public switched telephone network. Furthermore, a superordinated unit (not shown) or a control device (not shown) can also directly communicate with the radio network shown via a corresponding radio circuit.

Figure 2:
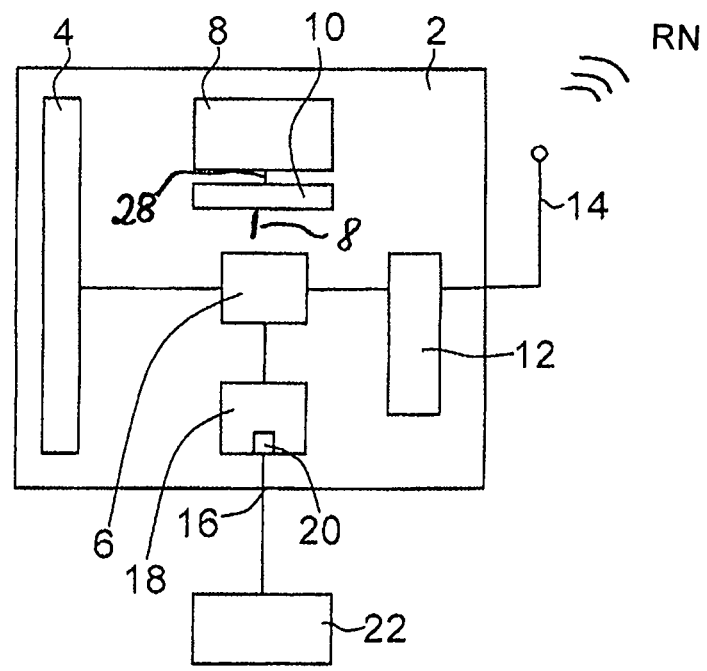
FIG. 2 is a schematic representation of the block diagram of a radio field device, in which the solution according to the invention is employed.
Figure 3:
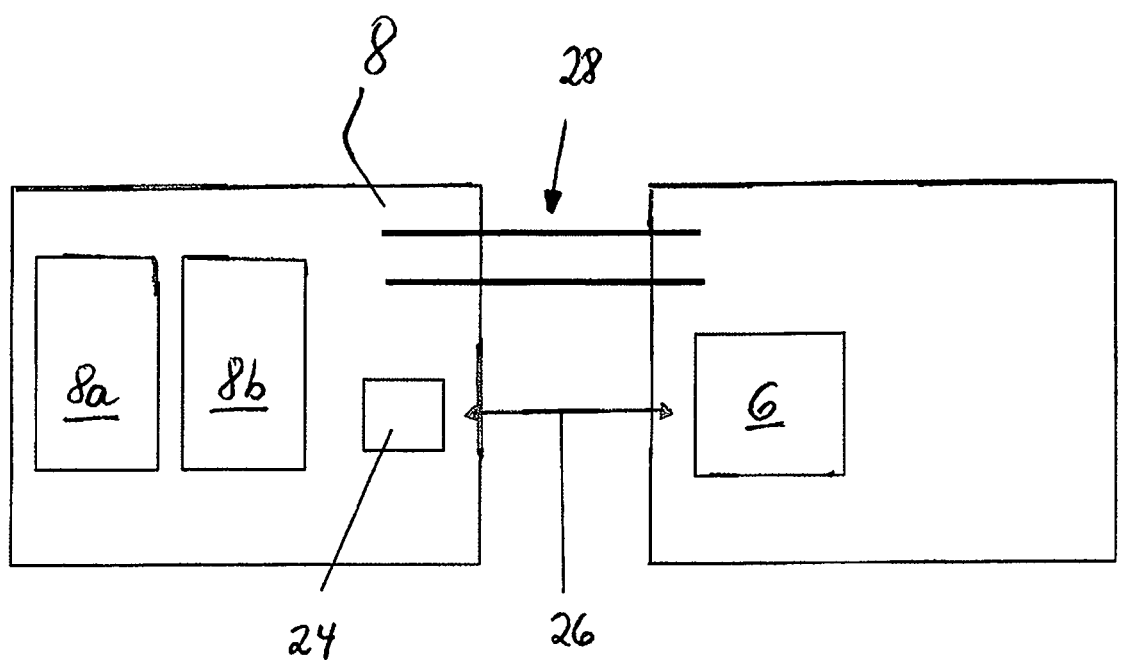
FIG. 3 is a schematic representation of an embodiment of the apparatus according to the invention.

In FIG. 2, a block diagram of a radio field device 2 is schematically represented. The radio field device 2 is embodied as a sensor and can, for example, form one of the represented radio field devices F1, F2, . . . , F6. It exhibits a measured value transducer 4, a control unit in the form of a microprocessor 6, a battery pack 8 having at least one battery 8*a*, 8*b*, . . . , and a voltage converter 10 which is connected to the battery pack 8. For measured value processing, the microprocessor 6 is, as a rule, connected with the measured value transducer 4 via an analog/digital transducer and an amplifier.

The battery pack 8 forms an autarkic power source for powering all of the system components of the radio field device 2. In each case, the voltage converter 10 transforms the voltage supplied by the battery pack 8 to a voltage value required for each of the system components. Via the voltage converter 10 and energy supply lines 28, the individual system components of the radio field device 2 are supplied with electrical power from the battery pack 8.

For the exchange of data with the superordinated unit 30, the microprocessor 6 is connected with a radio unit 12, which exhibits an RF chipset and an antenna 14. The radio unit 12 is designed in such a way that a wireless communication occurs in the case shown according to the HART standard. The radio field device 2 furthermore exhibits a hardwired communication interface 16. The hardwired communication interface 16 is, once again, designed according to the HART standard. The hardwired communication interface 16 is associated with an ASIC 18, through which the sending and receiving of signals occurs via the communication interface 16, and which, for the exchange of data, is in contact with the microprocessor 6. A HART handheld communicator 22 can be connected to the hardwired communication interface 16 in order to configure the radio field device F1 onsite. As previously mentioned, the configuration/parametering of the field device F2 can also occur from the superordinated control unit 20 of the radio network RN.

FIG. 2 shows a schematic representation of an embodiment of the apparatus according to the invention. In the battery pack 8, which is associated with a field device F1, two batteries, 8a, 8b, are provided for. The battery pack 8 is either directly integrated into or associated with the field device F1 (as is shown in FIG. 2) or the battery pack is integrated into the wireless adapter.

According to the invention, a data storage device 24 is associated with the batteries 8a, 8b. In this data storage device 24, specific information is stored concerning the battery pack 8; 8a, 8b or the rechargeable battery. The supplying of the system components of the field device F1 with energy occurs via the energy supply line 28.

Furthermore, according to the invention, process-specific and operation-specific information about the energy consumption is written to the data storage unit 24. The process- or operation-specific information is written to the data storage unit 24 at specific intervals of time or triggered by specific events. It is hereby possible in the case of the use of the battery 8; 8a 8b or the rechargeable battery in a second automation technology field device F2 to calculate and/or output the remaining service life of the battery 8; 8a 8b or the rechargeable battery on the basis of the process- and operation-specific information. For this purpose, the data storage unit 24 is connected via a serial data line 26 with the microprocessor 6. For example, on the basis of a sum formation of empirically ascertained consumption information for a parametering process or for the standard operation of the field device (e.g. the provision of measured values) at predetermined or externally triggered time intervals, the microprocessor calculates the remaining service life or the remaining capacity of the battery pack 8, the batteries 8a, 8b or the rechargeable battery.

The invention claimed is:

1. A method for monitoring the charge level or remaining capacity of a battery pack, a disposable battery or a rechargeable battery, which is used to supply energy for an automation technology field device wherein a data storage unit and a microprocessor associated with the battery pack, the disposable battery or the rechargeable battery, comprising the steps of:
   storing specific information about the battery pack, the disposable battery or the rechargeable battery in the data storage unit;
   writing process-specific and operation-specific information about energy consumption of a field device associated with the battery pack, disposable battery or rechargeable battery to the data storage unit, at one of: specific intervals of time and specific events; and
   in the case of the battery pack, the disposable battery or the rechargeable battery being separated from the associated field device and used in another field device, the remaining service life of the battery pack, the disposable battery or the rechargeable battery is newly calculated and output on the basis of a sum formation of the process- and operation-specific information stored in said data storage by the microprocessor.

2. The method as claimed in claim 1, wherein:
   storage of the process- and/or operation-specific information is manually initiated.

3. The method as claimed in claim 1, wherein:
   the storage of the process- and/or operation-specific information occurs automatically.

4. The method as claimed in claim 1, wherein:
   the stored information is taken into consideration for diagnosis of the battery pack, the disposable battery or the rechargeable battery.

5. An apparatus for monitoring the charge level or remaining capacity of a battery pack, a disposable battery or a rechargeable battery, which is used to supply energy for an automation technology, field device, comprising
   a data storage unit for the field device; wherein:
   said data storage unit, is associated with the battery pack, the disposable battery, or the rechargeable battery respectively;
   specific information about the battery pack, disposable battery or rechargeable battery is stored in said data storage unit;
   a microprocessor connected to said data storage unit, whereby wherein the microprocessor is adapted to write; writes process-specific and operation-specific information about energy consumption of the field device associated with the battery pack, disposable battery or rechargeable battery to said data storage unit at one of: specific intervals of time and specific events; and
   in the case of the battery pack; disposable battery or rechargeable battery being used in a second automation technology field device, the remaining service life of the battery pack, the disposable battery or the rechargeable battery is calculated and output on the basis of a sum formation of the process- and operation-specific information stored in said data storage by the microprocessor.

6. The apparatus as claimed in claim 5, wherein:
   the specific information concerning the battery pack, the disposable battery or the rechargeable battery involves information that allows the battery pack, the disposable battery or the rechargeable battery to be uniquely identified.

7. The apparatus as claimed in claim 5, wherein:
   said specific event involves a process with high energy consumption, e.g. configuring or parametering the field device.

8. The apparatus as claimed in claim 5, wherein:
the battery pack, the disposable battery or the rechargeable battery is integrated into the field device or into an adapter on the field device for radio transmission of data between the field device and a superordinated control unit.

\* \* \* \* \*